（12） United States Patent
Kawada et al.

(10) Patent No.: US 7,282,308 B2
(45) Date of Patent: Oct. 16, 2007

(54) PHASE SHIFTER FILM AND PROCESS FOR THE SAME

(75) Inventors: Susumu Kawada, Saitama (JP);
Akihiko Isao, Saitama (JP); Nobuyuki Yoshioka, Hyogo (JP); Kazuyuki Maetoko, Hyogo (JP)

(73) Assignees: Ulvac Coating Corporation, Saitama (JP); Renesas Technology Corp., Tokyo (JP)

( * ) Notice: Subject to any disclaimer, the term of this patent is extended or adjusted under 35 U.S.C. 154(b) by 0 days.

(21) Appl. No.: 11/477,425

(22) Filed: Jun. 30, 2006

(65) Prior Publication Data

US 2007/0009810 A1    Jan. 11, 2007

Related U.S. Application Data

(60) Division of application No. 09/804,158, filed on Mar. 13, 2001, now Pat. No. 7,090,947, which is a continuation of application No. PCT/JP00/04709, filed on Jul. 13, 2000.

(30) Foreign Application Priority Data

Jul. 14, 1999    (JP) ................................ 11-199941

(51) Int. Cl.
*G03F 1/00*    (2006.01)
(52) U.S. Cl. ........................................................ 430/5
(58) Field of Classification Search ............... 430/5; 204/192.15, 192.3, 192.17, 192.22

See application file for complete search history.

(56) References Cited

U.S. PATENT DOCUMENTS

| 5,322,605 | A |   | 6/1994 | Yamanishi | ............. 204/298.07 |
| 5,474,864 | A |   | 12/1995 | Isao et al. | |
| 5,482,799 | A |   | 1/1996 | Isao et al. | |
| 5,605,776 | A |   | 2/1997 | Isao et al. | |
| 5,614,335 | A |   | 3/1997 | Hashimoto et al. | |
| 5,635,315 | A |   | 6/1997 | Mitsui | |
| 5,725,739 | A | * | 3/1998 | Hu | ........................ 204/192.3 |
| 5,728,494 | A |   | 3/1998 | Kawano et al. | |
| 5,804,337 | A |   | 9/1998 | Mitsui | |
| 5,863,393 | A |   | 1/1999 | Hu | ........................ 204/192.3 |

(Continued)

FOREIGN PATENT DOCUMENTS

EP        0 692 551 A1    1/1996

(Continued)

OTHER PUBLICATIONS

Tom Smy et al.; "A simulation study of long throw sputtering . . . "; IEEE Trans., Elec. Dev.: v45 (1998);p. 1414-1425.

(Continued)

*Primary Examiner*—S. Rosasco
(74) *Attorney, Agent, or Firm*—McDermott Will & Emery LLP

(57) ABSTRACT

In the formation of a halftone type phase shift mask, a reactive gas introduction inlet and an inert gas introduction inlet are provided so as to introduce the respective gases separately and by using a reactive low throw sputtering method a molybdenum silicide based phase shifter film is formed. Thereby, it becomes possible to provide a halftone type phase shift mask, which is applicable to an ArF laser or to a KrF laser, by using molybdenum silicide based materials.

3 Claims, 10 Drawing Sheets

U.S. PATENT DOCUMENTS

| | | |
|---|---|---|
| 5,897,976 A | 4/1999 | Carcia et al. |
| 5,897,977 A | 4/1999 | Carcia et al. |
| 5,938,897 A | 8/1999 | Isao et al. .............. 204/192.15 |
| 5,939,225 A | 8/1999 | Dove et al. |
| 5,939,925 A | 8/1999 | Shibata et al. |
| 5,942,356 A * | 8/1999 | Mitsui et al. ................... 430/5 |
| 5,952,128 A | 9/1999 | Isao et al. ....................... 430/5 |
| 5,955,223 A | 9/1999 | Mitsui et al. ................... 430/5 |
| 6,087,047 A | 7/2000 | Mitsui et al. |
| 6,139,698 A | 10/2000 | Wang et al. ........... 204/192.15 |
| 6,140,236 A | 10/2000 | Restaino et al. ............ 438/687 |
| 6,309,780 B1 | 10/2001 | Smith |
| 6,458,255 B2 * | 10/2002 | Chiang et al. ......... 204/192.15 |

FOREIGN PATENT DOCUMENTS

| | | |
|---|---|---|
| JP | 5-285327 | 11/1993 |
| JP | 6-258817 | 9/1994 |
| JP | 8-74031 | 3/1996 |
| JP | 8-127870 | 5/1996 |
| JP | 8-262688 | 10/1996 |
| JP | 11-21669 | 1/1999 |

OTHER PUBLICATIONS

D. Konpka et al.; Bipolar pulsed DC sputtering of Optical Films; Soc. Vac. Coaters, Conf. Procs (1999); p. 217-222.

Motegi et al.: "Long throw low pressure sputtering technology for very large scale integrated devices"; Jl. Vac. Sc. Tech. B, v13 (1995), pp. 1906-1909.

Marie Angelopoulos, "Conducting polymers in microelectronics", Handbook of Conducting Polymers, Marcel Dekker, NY, 1998, pp. 921-944.

* cited by examiner

ELECTRIC FIELD ON THE MASK

LIGHT INTENSITY ON THE WAFER

PHASE SHIFTER FILM AND PROCESS FOR THE SAME

RELATED APPLICATION

This application is a divisional application of Ser. No. 09/804,158, filed Mar. 13, 2001 now U.S. Pat. No. 7,090,947, which is a continuation or continuation-in-part filed under 35 USC 111(a) of International Application No. PCT/JP00/04709, filed Jul. 13, 2000, which claims priority of Japanese Patent application No. 11-199941 (P), filed Jul. 14, 1999, and the contents of which are herewith incorporated by reference.

This application is a continuation of International Application No. PCT/JP00/04709, whose international filing date is Jul. 13, 2000, which in turn claims the benefit of Japanese Patent Application No. 11-199941, filed Jul. 14, 1999, the disclosure of which Application is incorporated by reference herein. The benefit of the filing and priority dates of the International and Japanese Applications is respectfully requested.

BACKGROUND OF THE INVENTION

1. Field of the Invention

This invention relates to a phase shift mask, in particular to a structure of an attenuation type phase shift mask which attenuates light of exposure wavelength and a process for the same.

2. Description of the Background Art

The making of semiconductor integrated circuits of large scale and the miniaturization thereof has been remarkable. Together with that the miniaturization of circuit patterns formed on semiconductor substrates (hereinafter referred to simply as wafers) has been progressing rapidly.

Particularly, photolithographic technology is widely recognized as a basic technology in pattern formation. Accordingly, a variety of developments and improvements have been carried out up to the present time. The miniaturization of patterns has been an unending process and the requirements for the improved resolution of patterns have become more demanding.

Accordingly, in recent years, a phase shift exposure method using a phase shift mask has been proposed as a technology to satisfy these requirements and "Phase Shift Mask and Process for the Same as well as Exposure Method Using That Phase Shift Mask" (hereinafter referred to as background technology 1), disclosed in the Japanese Patent Laying-Open No. 5-285327(1993), "Process for Phase Shift Photo Mask Blanks, Phase Shift Photo Mask Blanks and Phase Shift Photo Mask" (hereinafter referred to as background technology 2), disclosed in the Japanese Patent Laying-Open No. 8-74031(1996), and "Titanium Nitride Thin Film Formation Method" (hereinafter referred to as background technology 3), disclosed in the Japanese Patent Laying-Open No. 8-127870(1996), are sited as a technology related to the above phase shift mask.

Background technologies 1 and 2 concretely disclose a molybdenum silicide type halftone phase shift mask and a process for the same, wherein a reactive sputtering using a direct current magnetron discharge is adopted in a film formation style of phase shifter film.

In addition, in background technology 1, as for supplied gases, Ar is used for an inert gas, 02 or (02+N2) is used for a reactive gas while a mixture gas system is adopted as a gas supply system.

In addition, in background technology 2, as for supplied gases, Ar is used for an inert gas, NO is used for a reactive gas while a mixture gas system is adopted as a gas supply system in the same way as in background technology 1.

In addition, in background technology 3, a reactive low pressure sputtering method through a direct current magnetron discharge and a unit therefore are concretely disclosed and the purpose of this background technology 3 is to provide a titanium nitride thin film formation method of which the filling in characteristics inside of microscopic holes is maintained at an excellent level and of which the film thickness distribution of the thin film on the substrate surface is uniform.

In order to achieve this purpose, in background technology 3, a so-called long throw sputtering method (hereinafter referred to as LTS method) is adopted where the pressure is maintained at $1 \times 10^{-1}$ Pa ($7.5 \times 10^{-4}$ Torr) or less under an Ar+N2 gas atmosphere and the mixture gas composition is set at $1/8 \leq Ar/N2 \leq 1/3$ as a flow amount ratio in order to gain a uniform titanium nitride thin film distribution. Here, as for the distance (T/S) between the target and the substrate, 140 mm, 170 mm and 200 mm are selected.

Based on the technologies shown in the above described background technologies 1 to 3, however, in the case that a thin film which is used as a phase shift mask, particularly a phase shifter film, is formed a thin film which has sufficient optical characteristics (particularly transmittance) cannot be formed.

In particular, a molybdenum silicide type phase shifter film which is formed based on background technologies 1 and 2 cannot be provided for practical use because the transmittance of the halftone phase shift mask in the ArF laser exposure wavelength (193 nm) is very small.

In addition, film formation is possible only when the transmittance of a halftone phase shift mask in the KrF laser exposure wavelength (248 nm) is less than 8% which becomes a problem in practical use.

Accordingly, this invention is provided to solve the above described problems and provides a halftone type phase shift mask which can be applied in an ArF laser or a KrF laser by using a molybdenum silicide type material. In addition, relating to this phase shift mask, the provision of a process for the gaining of that phase shift mask in addition to the provision of: a phase shifter film and a process for the same, blanks for a phase shift mask and a process for the same, an exposure method by using that phase shift mask, a semiconductor device manufactured by using that phase shift mask, a defect inspection method of that phase shift mask and a defect correction method of that phase shift mask are additional purposes.

Based on this invention, as shown in the above described purposes, a halftone phase shift mask which can be applied in an ArF laser or in a KrF laser can be formed of a molybdenum silicide type material. Since the same production process and production units as are used in background technologies 1 or 2 can be applied as they are for the molybdenum silicide type material a new large scale investment for facilities can be avoided. It also becomes possible to save the labor, time and development costs which would be needed for developing a new production process.

More concretely, it becomes possible to form a molybdenum silicide type thin film through an LTS method, that is to say, a reactive sputtering method by means of direct current magnetron discharge so as to form a thin film which has an excellent transmittance by applying the above film to a phase shifter film and, thereby, it becomes possible to manufacture a halftone type phase shift mask for ArF laser exposure which used to be impossible through a sputtering system as shown in the background technology.

SUMMARY OF THE INVENTION

The main structure of this invention is described in detail as follows.

In a sputtering system using an LTS method, (i) the pressure is $7.5\times10^{-4}$ Torr or less, (ii) the distance (hereinafter referred to as the distance between T/S) between the target and the substrate is 100 mm or more, preferably, 400 mm or more, (iii) the flow amount ratio of the reactive gas to the inert gas is 50%≦reactive gas/(reactive gas+inert gas)≦80% and, preferably, $N_2O$ is used as the reactive gas and Ar is used as the inert gas.

(iv) As for a gas supply system, though either a mixture gas supply system wherein reactive gas and inert gas are mixed to be supplied into a vacuum tank or a gas separation system wherein reactive gas is blown to the substrate while inert gas is supplied in the vicinity of the sputtering target is adoptable, the gas separation system is preferable because a better result can be gained.

Here, the reasons why the gas separation system is used and the distance between T/S is made to be 400 mm or more are shown as follows.

First, the reason why the gas separation system is preferable is described as follows. In the mixture gas supply system, it cannot be avoided that the reactive gas reach the sputtering target surface with the effect of oxidizing the surface of the target. A molybdenum silicide oxide film or a molybdenum silicide oxide nitride film which are formed on the surface of the molybdenum silicide target have the property of electrical insulation and, therefore, the deposition rate of the film onto the substrate is rapidly lowered so as to result in the failure of film formation when the reactive gas is supplied in the amount of a predetermined value or more.

Since the halftone type phase shifter film requires a high transmittance, the restriction of the supply amount of this reactive gas is a very disadvantageous phenomenon and, therefore, this mixture gas supply system cannot fully take advantage of the LTS system. In comparison with the background technology though a considerably improved result can, of course, be gained further improvement is desired.

Next, the reason why the distance between T/S is made to be 400 mm or more is shown as follows. By making the distance between T/S be 400 mm or more and by adopting the gas separation system, the amount of reactive gas, which has been supplied toward the substrate and which reaches the sputtering target, becomes less so that the above described problems as shown in the mixture gas supply system can be avoided since the substrate and the sputtering target are fully separated.

Accordingly, it becomes possible to enhance the reactive gas ratio so that a phase shifter film, of which the degree of oxidation and nitriding of molybdenum silicide is high, can be formed on the substrate and, therefore, it becomes possible to gain a phase shifter film which has a high transmittance in the exposure wavelength using an ArF laser or a KrF laser.

In the case that the distance between T/S is made to be less than 400 mm, the effect of gas separation becomes insufficient so that the majority part of the reactive gas which has been supplied to the substrate reaches the sputtering target so as to exhibit unfavorable effects.

Although, the molybdenum silicide oxide nitride film on the sputtering target surface causes an abnormal discharge and becomes the cause of thin film defect generation, this is avoided in order to gain a phase shift mask with a low defect level.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, each embodiment based on this invention is described.

First Embodiment

Figure 1:
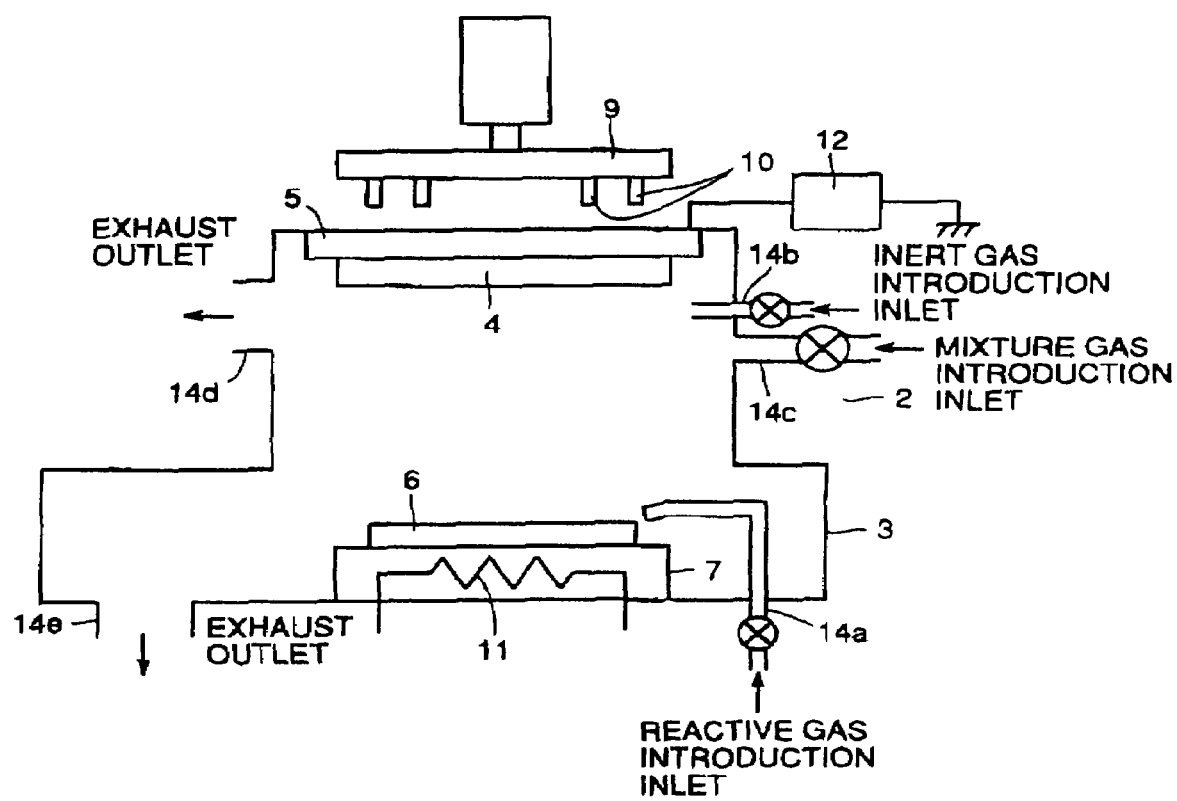
FIG. 1 is a schematic diagram showing a configuration of a sputtering unit in which an LTS method is adopted.

First, referring to FIG. 1 a sputtering unit for forming a phase shift film based on this invention by using an LTS method is described.

The sputtering unit as shown in FIG. 1 is a schematic diagram showing the configuration of a sputtering unit 1000 which can implement an LTS method.

This sputtering unit 1000 includes a low pressure vacuum tank 3. The vacuum tank 3 has a reactive gas inlet 14a, an inert gas inlet 14b and a mixture gas inlet 14c. In addition, it has two vacuum exhaust outlets 14d and a vacuum exhaust outlet 14e. It also has a target electrode 5 and a substrate holder 7.

A vacuum pump, which is not shown, is connected to the vacuum exhaust outlets 14d and the vacuum exhaust outlet 14e while a magnet plate 9, which has magnets 10 arranged in double concentric circles, is provided on the back side of the target electrode 5 and a heater 11 is provided on the backside of the substrate holder 7. At the time of film formation molybdenum silicide is used as a target.

EXAMPLE 1

Next, concrete film formation conditions in Example 1 of film formation of molybdenum silicide oxide nitride film are described as follows.

T/S distance: 400 mm
sputtering current: 1.7 A to 3.2 A
sputtering voltage: 530V to 570V
sputtering power: 1 kW
substrate temperature: 50 degrees (° C.) to 120 degrees (° C.)
film thickness: 740 Å to 3300 Å
sputtering time: 7 min to 12 min (stationary film formation)
28 min to 56 min (rotational film formation)
gas separation system: blowing of reactive gas to substrate supply of inert gas to target Under the above described conditions the gas flow amount rate (%: Ar/N$_2$O), the gas flow amount (sccm), the pressure (×10$^{-4}$ Torr), the deposition rate (Å/min), the film formation system and the gas supply system are appropriately selected so that the samples TO1 to TO9, TR3, 4, 6, TA1 to TA4, which have been formed in films, are shown in Table 1 below.

TABLE 1

Film Formation Conditions TO1 ~ (Embodiment) Example 1

| Sample | Gas flow amount ratio % Ar | N$_2$O | Gas flow amount SCCM Ar | N$_2$O | Pressure (×10$^{-4}$ Torr) | Deposition rate Å/min | Film formation system | Reactive gas supply system | Note |
|---|---|---|---|---|---|---|---|---|---|
| TO1 | 44.44 | 55.56 | 12 | 15 | 4.6 | 205 | Stationary | Gas | T/S400 mm |
| TO2 | 37.5 | 62.5 | 12 | 20 | 4.9 | 207 | film | separation | |
| TO3 | 32.43 | 67.57 | 12 | 25 | 5.6 | 206.2 | formation | | |
| TO4 | 28.57 | 71.43 | 12 | 30 | 5.9 | 193.8 | | | |
| TO5 | 28.57 | 71.43 | 12 | 30 | 6.0 | 190.4 | | | |
| TO6 | 25.33 | 74.47 | 12 | 35 | 6.9 | 181.2 | | | |
| TO7 | 23.08 | 76.92 | 12 | 40 | 8.0 | 120 | | | |
| TO8 | 21.05 | 78.95 | 12 | 45 | 8.8 | 110.4 | | | |
| TO9 | 18.03 | 81.97 | 11 | 50 | 9.6 | 88.75 | | | |
| TR3 | 32.43 | 67.57 | 12 | 25 | 5.3 | 439.8*[1] | Rotational | Gas | |
| TR4 | 28.57 | 71.43 | 12 | 30 | 6.2 | 416.5*[1] | film | separation | |
| TR6 | 25.53 | 74.47 | 12 | 35 | 6.8 | 380.2*[1] | formation | | |
| TA1 | 0 | 100 | 0 | 30 | 4/2 | 90.62 | Stationary | Gas | |
| TA2 | 9.09 | 90.91 | 3 | 30 | 4.6 | 105.7 | film | separation | |
| TA3 | 50.82 | 49.18 | 31 | 30 | 10 | 210.8 | formation | | |
| TA4 | 76.56 | 23.44 | 98 | 30 | 30 | 200 | | | |

*[1]value converted to stationary formed film (=7.243 × film thickness of rotationally formed film)

EXAMPLE 2

Next, concrete film formation conditions in Example 2 of film formation of molybdenum silicide oxide nitride film are described as follows.

T/S distance: 400 mm
sputtering current: 1.7 A to 3.2 A
sputtering voltage: 530V to 570V
sputtering power: 1 kW
substrate temperature: 50 degrees (° C.) to 120 degrees (° C.)
film thickness: 740 Å to 3300 Å
sputtering time: 7 min to 12 min (stationary film formation)
mixture gas system: mixing of reactive gas and inert gas so as to be supplied into vacuum tank Under the above described conditions the gas flow amount rate (%: Ar/N$_2$0), the gas flow amount (sccm), the pressure (×10$^{-4}$ Torr), the deposition rate (Å/min), the film formation system and the gas supply system are appropriately selected so that the resultant samples TMX1 to TMX3, which have been formed in films, are shown in Table 2 below.

TABLE 2

Film Formation Conditions TMX1 ~ (Embodiment) Example 2

| TMX1 | 80 | 20 | 24 | 6 | 4.6 | 210 | Rotational | Mixture |
|---|---|---|---|---|---|---|---|---|
| TMX2 | 70 | 30 | 21 | 9 | 4.6 | 215 | film | Gas |
| TMX3 | 65 | 35 | 19.5 | 10.5 | 4.6 | 220 | formation | system |

EXAMPLE 3

Next, concrete film formation conditions in Example 3 of film formation of molybdenum silicide oxide nitride film are shown as follows.

Figure 7:
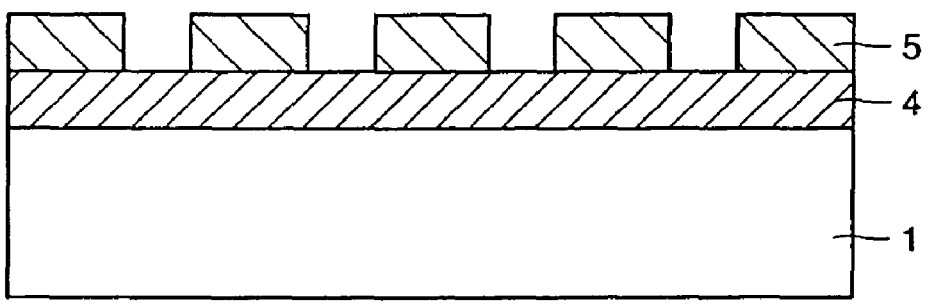
FIG. 7 is a cross section view showing the second step of a process for a phase shift mask according to the second and third embodiments based on this invention.

T/S distance: 400 mm
sputtering current: 1.92 A to 2.13 A
sputtering voltage: 465V to 524V
sputtering power: 1 kW
substrate temperature: 30 degrees (° C.) to 130 degrees (° C.)
film thickness: 830 A to 1300 A
sputtering time: 4 min to 10 min (stationary film formation) gas separation system: blowing of reactive gas to substrate
supply of inert gas to target Under the above described conditions the gas flow amount rate (%: $Ar/N_2O$), the gas flow amount (sccm), the pressure ($\times 10^{-4}$ Torr), the deposition rate (Å/min), the film formation system and the gas supply system are appropriately selected so that the samples TS 1 to TS4, TS6, TS7, which have been formed in films, are shown in Table 3 below.

molybdenum silicide oxide nitride film has a two layer structure as described in FIG. 7.

T/S distance: 400 mm
sputtering current: (upper layer) 1.91 A to 1.95 A
(lower layer) 2.05 A to 2.19 A
sputtering voltage: (upper layer) 515V to 526V
(lower layer) 454V to 495V
sputtering power: (upper layer: lower layer) 1 kW
Substrate temperature: (upper layer: lower layer) 79 degrees (° C.) to 139 degrees (° C.)
entire film thickness: 900 A to 1100 A
sputtering time: (upper layer) 1.5 min (stationary film formation)
(lower layer) 3 min to 7 min (rotational film formation)
gas separation system: blowing of reactive gas to substrate
supply of inert gas to target Under the above described conditions the gas flow amount rate (%: $Ar/N_2O$), the gas flow amount (sccm), the pressure ($\times 10^{-4}$ Torr), the deposition rate (Å/min), the film formation system and the gas supply system are appropriately selected so that the resultant samples TM1 to TM4, which have been formed in films, are shown in Table 4 below.

TABLE 3

Film Formation Conditions TS 1 ~ (Embodiment) Example 3

| Sample | Gas flow amount ratio % Ar | $N_2O$ | Gas flow amount SCCM Ar | $N_2O$ | Pressure ($\times 10^{-4}$ Torr) | Film Deposition rate Å/min | Film formation system | Reactive gas supply system | Note |
|---|---|---|---|---|---|---|---|---|---|
| TS1 | 44.44 | 55.56 | 12 | 15 | 4.5 | 207.5 | Stationary film formation | Gas separation | T/S400 mm |
| TS2 | 37.5 | 62.5 | 12 | 20 | 4.8 | 222.6 | | | |
| TS3 | 32.43 | 67.57 | 12 | 25 | 5.3 | 206.2 | | | |
| TS4 | 28.57 | 71.43 | 12 | 30 | 6.0 | 200 | | | |
| TS6 | 25.33 | 74.47 | 12 | 35 | 6.8 | 208.3 | | | |
| TS7 | 23.08 | 76.92 | 12 | 40 | 8.0 | 135.1 | | | |

EXAMPLE 4

Next, concrete film formation conditions in Example 4 of film formation of molybdenum silicide oxide nitride film are described as follows. Here in the present example, the

TABLE 4

Film Formation Conditions TM1 ~ (Embodiment) Example 4

| Sampl Entire layer Upper layer Lower layer | Film thickness Å dTOT dU dL | Gas flow amount ratio % Ar | $N_2O$ | Gas flow amount SCCM Ar | $N_2O$ | Pressure ($\times 10^{-4}$ Torr) | Film Deposition rate Å/min | Film formation system | Reactive gas supply system | Note |
|---|---|---|---|---|---|---|---|---|---|---|
| TM1 | 971 | — | — | — | — | — | — | Stationary film formation | Gas separation | T/S400 mm |
| TU1 | 300 | 44.44 | 55.56 | 12 | 15 | 4.6 | 200 | | | T/S: distance |
| TL4 | 671 | 28.57 | 71.43 | 12 | 30 | 7.5 | 236.8 | | | between |
| TM2 | 1117.8 | — | — | — | — | — | — | | | target and |
| TU2 | 300 | 37.50 | 6.250 | 12 | 20 | 4.9 | 200 | | | substrate |
| TL7 | 817.8 | 23.08 | 76.92 | 12 | 40 | 7.9 | 169.2 | | | |
| TM3 | 1117.8 | — | — | — | — | — | — | | | |
| TU3 | 300 | 32.43 | 67.57 | 12 | 25 | 5.6 | 200 | | | |
| TL7a | 817.8 | 23.08 | 76.92 | 12 | 40 | 8.0 | 163.6 | | | |
| TM4 | 1166.8 | — | — | — | — | — | — | | | |
| TU3a | 300 | 32.43 | 67.57 | 12 | 25 | 5.3 | 200 | | | |
| TL8 | 866.8 | 21.05 | 78.95 | 12 | 45 | 8.8 | 123.8 | | | |

EXAMPLE 5

Here, for reference, film formation conditions of molybdenum silicide oxide nitride film according to the background technology as Example 5 are described as follows.

T/S distance: 80 mm gas separation system: blowing of reactive gas to substrate supply of inert gas to target Under the above described conditions the gas flow amount rate (%: $Ar/N_2O$), the gas flow amount (sccm), the pressure ($\times 10^{-4}$ Torr), the deposition rate (Å/min), the film formation system and the gas supply system are appropriately selected so that the resultant samples Q1-1 to Q1-4 and Q3-1 to Q3-3, which have been formed in films, are shown in Table 5 below.

TABLE 5

Film Formation Conditions Q1-1 ~ (Background Technology)

| Sample | Gas flow amount ratio % Ar | Gas flow amount ratio % $N_2O$ | Gas flow amount SCCM Ar | Gas flow amount SCCM $N_2O$ | Pressure ($\times 10^{-4}$ Torr) | Film Deposition rate Å/min | Film formation system | Reactive gas supply system | Note |
|---|---|---|---|---|---|---|---|---|---|
| Q1-1 | 92.00 | 8.00 | 230 | 20 | 60 | 683.4*[1] | Rotational film formation | Separation | T/S80 mm |
| Q1-2 | 88.46 | 11.54 | 230 | 30 | 60 | 735.2 | | | |
| Q1-3 | 86.79 | 13.21 | 230 | 35 | 62 | 704.2 | | | |
| Q1-4 | 85.18 | 14.81 | 230 | 40*[2] | 62 | 683 | | | |
| Q3-1 | 91.95 | 8.05 | 120 | 10.5 | 70 | 40216 | In-line film formation | Separation | T/S103 mm |
| Q3-2 | 91.95 | 8.05 | 120 | 10.5 | 70 | 416.8 | | | |
| Q3-3 | 89.55 | 10.45 | 120 | 40*[3] | 76 | 445.1 | | | |

*[1] value converted to stationary formed film (=17 × film thickness of rotationally formed film)
*[2] when $N_2O$ is supplied of 45 SCCM or more the deposition rate is dramatically reduced since the sputtering target is oxidized
*[3] when $N_2O$ is supplied of 80 SCCM or more the deposition rate is dramatically reduced since the sputtering target is oxidized Next, optical characteristics of each sample as shown in the above Examples 1 to 4 (Tables 1 to 4) with respect to an ArF laser (193 nm), a KrF laser (248 nm) and an i-line (365 nm) are shown in the following Table 6 "ArF laser (193 nm)," the following Table 7 "KrF laser (248 nm)" and the following Table 8 "i-line (365 nm)." Here, all of these respective samples are in the condition of "as deposited."

TABLE 6

Optical Characteristics T01 ~ (Embodiment), Condition as Deposited

| | ArF laser (193 nm) | | | | | Inspection wavelength (365 nm) | |
|---|---|---|---|---|---|---|---|
| | Optical constant | | Film thickness ds | Transmittance | Phase difference | Transmittance | |
| Sample | n | k | Å | % | ° | % | Note |
| TO1 | 2.450 | 0.8440 | 687.1 | 1.743 | 179.1 | 15.75 | |
| TO2 | 2.222 | 0.6180 | 807.8 | 3.310 | 179.6 | 25.72 | |
| TO3 | 2.226 | 0.5560 | 802.7 | 4.413 | 179.5 | 33.74 | |
| TO4 | 2.228 | 0.5328 | 800.4 | 5.02 | 179.4 | 26.08 | |
| TO5 | 2.278 | 0.5386 | 769.3 | 5.366 | 179.3 | 36.90 | |
| TO6 | 2.110 | 0.4727 | 882 | 5.476 | 179.5 | 37.47 | |
| TO7 | 1.933 | 0.3730 | 1045 | 6.744 | 179.7 | 43.42 | |
| TO8 | 1.815 | 0.3014 | 1194 | 8.34 | 179.8 | 60.82 | |
| TO9 | 1.759 | 0.2902 | 1282 | 7.795 | 179.8 | 65.89 | |
| TR3 | 2.337 | 0.5955 | 737.6 | 4.491 | 179.3 | 35.58 | |
| TR4 | 2.245 | 0.3612 | 782.9 | 12.80 | 178.8 | 36.15 | |
| TR6 | 2.049 | 0.4559 | 922.0 | 5.252 | 179.6 | 36.10 | |
| TA1 | 1.810 | 0.2657 | 1200 | 10.87 | 179.9 | 70.45 | |
| TA2 | 1.827 | 0.2720 | 1176 | 10.77 | 179.9 | 63.7 | |
| TA3 | — | — | — | — | — | — | |
| TA4 | 1.985 | 0.6076 | 1002 | 1.623 | 180.0 | 23.67 | |
| TMX1 | 2.194 | 6201 | 826.8 | 2.887 | 179.6 | 23.08 | |
| TMX2 | 2.131 | 0.5641 | 970.5 | 3.370 | 179.7 | 25.7 | |
| TMX3 | 2.00 | 0.4522 | 978.5 | 4.471 | 179.7 | 33.2 | |

TABLE 7

Optical Characteristics TO1 ~, KrF exposure light wavelength, Condition as Deposited

| | ArF laser (193 nm) | | | | Inspection wavelength | |
|---|---|---|---|---|---|---|
| | Optical constant | | Film thickness ds | Transmittance | Phase difference | (365 nm) Transmittance | |
| Sample | n | k | Å | % | ° | % | Note |
| TO1 | 2.262 | 0.8736 | 1016 | 0.895 | 179.1 | 6.74 | |
| TO2 | 2.171 | 0.5881 | 1082 | 3.259 | 179.5 | 15.91 | |
| TO3 | 2.110 | 0.4762 | 1134 | 5.380 | 179.4 | 20.79 | |
| TO4 | 2.030 | 0.4334 | 1220 | 5.798 | 179.5 | 20.68 | |
| TO5 | 2.046 | 0.4370 | 1201 | 5.889 | 179.4 | 20.66 | |
| TO6 | 1.934 | 0.3853 | 1342 | 9.248 | 1796 | 22.30 | |
| TO7 | 1.824 | 0.3007 | 1517 | 8.632 | 179.8 | 30.44 | |
| TO8 | 1.754 | 0.2380 | 1655 | 11.96 | 179.8 | 51.62 | |
| TO9 | 1.812 | 0.2208 | 1536 | 15.57 | 180.0 | 60.50 | |
| TR3 | 2.111 | 0.4841 | 1134 | 5.147 | 179.4 | 19.98 | |
| TR4 | 1.990 | 0.4423 | 1269 | 4.944 | 179.5 | 19.10 | |
| TR6 | 1.912 | 0.3780 | 1374 | 6.197 | 179.6 | 22.34 | |
| TA1 | 1.800 | 0.1975 | 1558 | 18.27 | 180.1 | 62.70 | |
| TA2 | 1.764 | 0.2141 | 1633 | 14.91 | 179.9 | 53.70 | |
| TA3 | 2.213 | 0.5139 | 1123 | 4.442 | 179.4 | 19.90 | |
| TA4 | 1.939 | 0.5181 | 1344 | 2.531 | 179.7 | 15.13 | |
| TMX1 | 2.054 | 0.5997 | 1202.6 | 2.173 | 17.02 | 11.97 | |
| TMX2 | 2.003 | 0.5312 | 1259 | 2.869 | 179.7 | 14.26 | |
| TMX3 | 1.899 | 0.3943 | 1394.4 | 5.327 | 179.5 | 21.21 | |

TABLE 8

Optical Characteristics T01 ~, i · line exposure light wavelength, Condition as Deposited

| | ArF laser (193 nm) | | | | | Inspection wavelength | |
|---|---|---|---|---|---|---|---|
| | Optical constant | | Film thickness ds | Transmittance | Phase difference | (365 nm) Transmittance | |
| Sample | n | k | Å | % | ° | % | Note |
| TO1 | 2.452 | 0.6827 | 1289 | 3.654 | 178.8 | 3.65 | |
| TO2 | 2.261 | 0.4202 | 1465 | 9.652 | 178.6 | 9.65 | |
| TO3 | 2.167 | 0.3376 | 1578 | 13.20 | 179.0 | 13.20 | |
| TO4 | 2.098 | 0.3200 | 1677 | 13.24 | 179.3 | 13.24 | |
| TO5 | 2.104 | 0.3247 | 1668 | 12.99 | 179.3 | 12.99 | |
| TO6 | 2.000 | 0.2813 | 1839 | 14.38 | 179.8 | 14.38 | |
| TO7 | 1.854 | 0.1974 | 2149 | 20.10 | 180.2 | 20.10 | |
| TO8 | 1.791 | 0.0910 | 2313 | 42.06 | 180.6 | 10.57 | |
| TO9 | 1.733 | 0.0673 | 2494 | 48.87 | 180.3 | 48.87 | |
| TR3 | 2.162 | 0.3488 | 1586 | 12.32 | 179.0 | 12.32 | |
| TR4 | 2.063 | 0.3289 | 173 | 11.86 | 179.4 | 11.86 | |
| TR6 | 1.970 | 0.2766 | 1896 | 14.08 | 179.9 | 14.08 | |
| TA1 | 1.706 | 0.0612 | 2589 | 50.73 | 180.1 | 50.73 | |
| TA2 | 1.701 | 0.0875 | 2610 | 40.07 | 180.0 | 40.07 | |
| TA3 | 2.182 | 0.3514 | 1559 | 12.49 | 178.9 | 12.45 | |
| TA4 | 2.068 | 0.3638 | 1726 | 9.683 | 179.4 | 9.683 | |
| TMX1 | 2.178 | 0.4549 | 1571.2 | 6.996 | 179.0 | 6.996 | |
| TMX2 | 2.110 | 0.3980 | 1662.3 | 8.544 | 179.1 | 8.54 | |
| TMX3 | 1.973 | 0.2840 | 189.04 | 13.48 | 179.8 | 13.48 | |

Next, the optical constants of the samples TS1 to TS4, TS6 and TS7 which have been formed to a film in the above described Example 2 with respect to an ArF laser (193 nm), a KrF laser (248 nm) and an i-line (365 nm) are shown in Table 9 below. Here, these samples are sintered products to which a heat treatment of 350 degrees (° C.) and 3 hr is applied.

TABLE 9

Optical Characteristics TS1 ~, respective wavelengths, 350 degrees(° C.), 3 hr, sintered product

| Sample | ArF laser 193 nm | | KrF laser 248 nm | | i · line 365 nm | | Note |
|---|---|---|---|---|---|---|---|
| | n | k | n | k | N | k | |
| TS1 | 2.429 | 0.9140 | 2.268 | 0.7835 | 2.362 | 0.6174 | |
| TS2 | 2.260 | 0.5895 | 2.124 | 0.4703 | 2.153 | 0.3127 | |
| TS3 | 2.300 | 0.5668 | 2.120 | 0.4461 | 2.141 | 0.3122 | |
| TS4 | 1.909 | 0.4564 | 1.969 | 0.3643 | 2.001 | 0.2636 | |
| TS6 | 1.892 | 0.3963 | 1.913 | 0.3120 | 1.852 | 0.2216 | |
| TS7 | 1.722 | 0.2678 | 1.781 | 0.1976 | 1.714 | 0.0445 | |

Next, the optical constants of the samples TM1 to TM4, which have been formed to a film in the above described Example 4 with respect to an ArF laser (193 nm) and an inspection wavelength (248 nm, 365 nm) are shown in Table 10 below. Here, these samples are sintered products to which a heat treatment of 350 degrees (° C.) and 3 hr is applied.

TABLE 10

Optical Characteristics TM1 ~, ArF laser, 350 degrees(° C.), 3 hr, sintered product

| | ArF Laser (193 nm) | | Inspection wavelength | | |
|---|---|---|---|---|---|
| | | | 365 nm | | |
| Sample | Transmittance n % | Phase difference k deg. | 248 nm Transmittance n % | Phase difference k deg. | Note |
| TM1 | 2.1 | −175 | 4.48 | 22.68 | |
| TM2 | 4.88 | −176 | 13.81 | 33.44 | |
| TM3 | 5.87 | −180 | 16.99 | 36.70 | |
| TM4 | 8.98 | −177 | 18.36 | 42.44 | |

Next, the optical characteristics of the samples Q1-1 to Q1-4 which have been formed to a film in the above described background technology with respect to an ArF laser (193 nm) and an inspection wavelength (365 nm) are shown in the following Table 11. Here, these samples are in the condition as deposited. And data of the samples Q3-1 to Q3-3 cannot be gained.

TABLE 11

Optical Characteristics Q1-1 ~, ArF exposure light wavelength, Condition as Deposited

| | ArF laser (193 nm) | | | | | Inspection wavelength (365 nm) | |
|---|---|---|---|---|---|---|---|
| | Optical constant | | Film thickness ds | Transmittance | Phase difference | Transmittance | |
| Sample | n | k | Å | % | ° | % | Note |
| Q1-1 | 2.278 | 0.6820 | 774.4 | 2.557 | 179.5 | 21.94 | |
| Q1-2 | 2.018 | 0.5476 | 966.2 | 2.696 | 179.8 | 30.63 | |
| Q1-3 | 1.979 | 0.4587 | 999.9 | 4.285 | 179.7 | 27.94 | |
| Q1-4 | 1.939 | 0.3962 | 1039 | 5.848 | 179.6 | 38.78 | |
| Q3-1 | — | — | — | — | — | — | |
| Q3-2 | — | — | — | — | — | — | |
| Q3-3 | — | — | — | — | — | — | |

Next, the optical characteristics of the samples Q1-1 to Q1-4 and Q3-1 to Q3-3 which have been formed to a film in the above described background technology with respect to a KrF laser (248 nm) and an inspection wavelength (365 nm) are shown in the following Table 12. Here, these samples are in the condition as deposited.

TABLE 12

Optical Characteristics Q1-1 ~, KrF exposure light wavelength, Condition as Deposited

| | KrF laser (248 nm) | | | | | Inspection wavelength (365 nm) | |
|---|---|---|---|---|---|---|---|
| | Optical constant | | Film thickness ds | Transmittance | Phase difference | Transmittance | |
| Sample | n | k | Å | % | ° | % | Note |
| Q1-1 | 2.053 | 0.6701 | 1207.2 | 1.401 | 179.6 | 9.682 | |
| Q1-2 | 1.960 | 0.4614 | 1310.4 | 3.998 | 179.6 | 20.30 | |
| Q1-3 | 1.906 | 0.3683 | 1382.7 | 6.526 | 179.6 | 27/30 | |
| Q1-4 | 1.847 | 0.3258 | 1477.2 | 7.584 | 179.7 | 26.60 | |

TABLE 12-continued

Optical Characteristics Q1-1 ~, KrF exposure light wavelength, Condition as Deposited

| Sample | KrF laser (248 nm) | | | | Inspection wavelength | |
|---|---|---|---|---|---|---|
| | Optical constant | | Film thickness ds | Transmittance | Phase difference | (365 nm) Transmittance | |
| | n | k | Å | % | ° | % | Note |
| Q3-1 | 2.040 | 0.9166 | 1234 | 0.2776 | 179.3 | 3.146 | |
| Q3-2 | 2.073 | 0.9062 | 1196 | 0.3496 | 179.3 | 3.421 | |
| Q3-3 | 2.017 | 0.7308 | 1253 | 0.826 | 179.6 | 6.79 | |

Next, the optical characteristics of the samples Q1-1 to Q1-4 and Q3-1 to Q3-3 which have been formed to a film in the above described background technology with respect to an i-line (365 nm) and an inspection wavelength (365 nm) are shown in the following Table 13. Here, these samples are in the condition as deposited.

TABLE 13

Optical Characteristics Q1-1 ~, i · line exposure light wavelength, Condition as Deposited

| Sample | i · line (365 nm) | | | | | Inspection wavelength | |
|---|---|---|---|---|---|---|---|
| | Optical constant | | Film thickness ds | Transmittance | Phase difference | (365 nm) Transmittance | |
| | n | k | Å | % | ° | % | Note |
| Q1-1 | 2.213 | 0.5034 | 1529.9 | 5.724 | 179.1 | 5.724 | |
| Q1-2 | 2.042 | 0.3066 | 1766.4 | 13.14 | 179.6 | 13.14 | |
| Q1-3 | 1.971 | 0.2395 | 1892 | 18.04 | 180.0 | 18.04 | |
| Q1-4 | 1.905 | 0.2271 | 2029.3 | 17.65 | 180.1 | 17.65 | |
| Q3-1 | 2.321 | 0.7553 | 1421 | 1.953 | 179.1 | 1.953 | |
| Q3-2 | 2.333 | 0.7576 | 1408 | 1.989 | 179.0 | 1.989 | |
| Q3-3 | 2.209 | 0.5702 | 1541 | 3.941 | 179.3 | 3.941 | |

Next, based on the contents of Tables 1 to 12 which show the above described film formation conditions, the evaluation of phase shift films including a molybdenum silicide oxide nitride film is shown as follows.

(Evaluation 1)

The evaluation of a phase shift film including a molybdenum silicide oxide nitride film in the case that the reactive gas is introduced in the separation condition as shown in the above described Example 1 is described.

Figure 2:
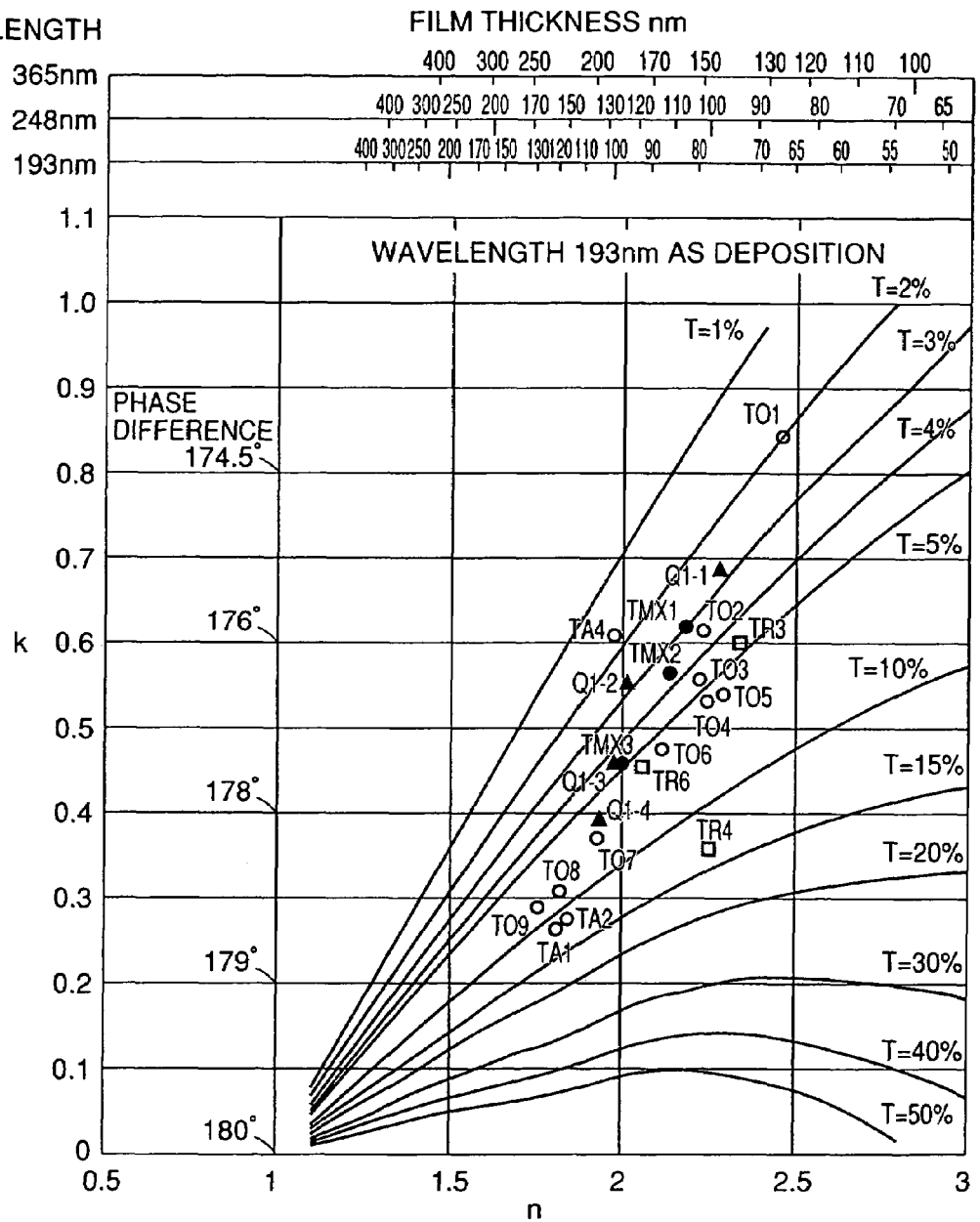
FIG. 2 is a diagram showing a phase shifter film of each sample in an ArF laser plotted based on its optical characteristics.
Figure 3:
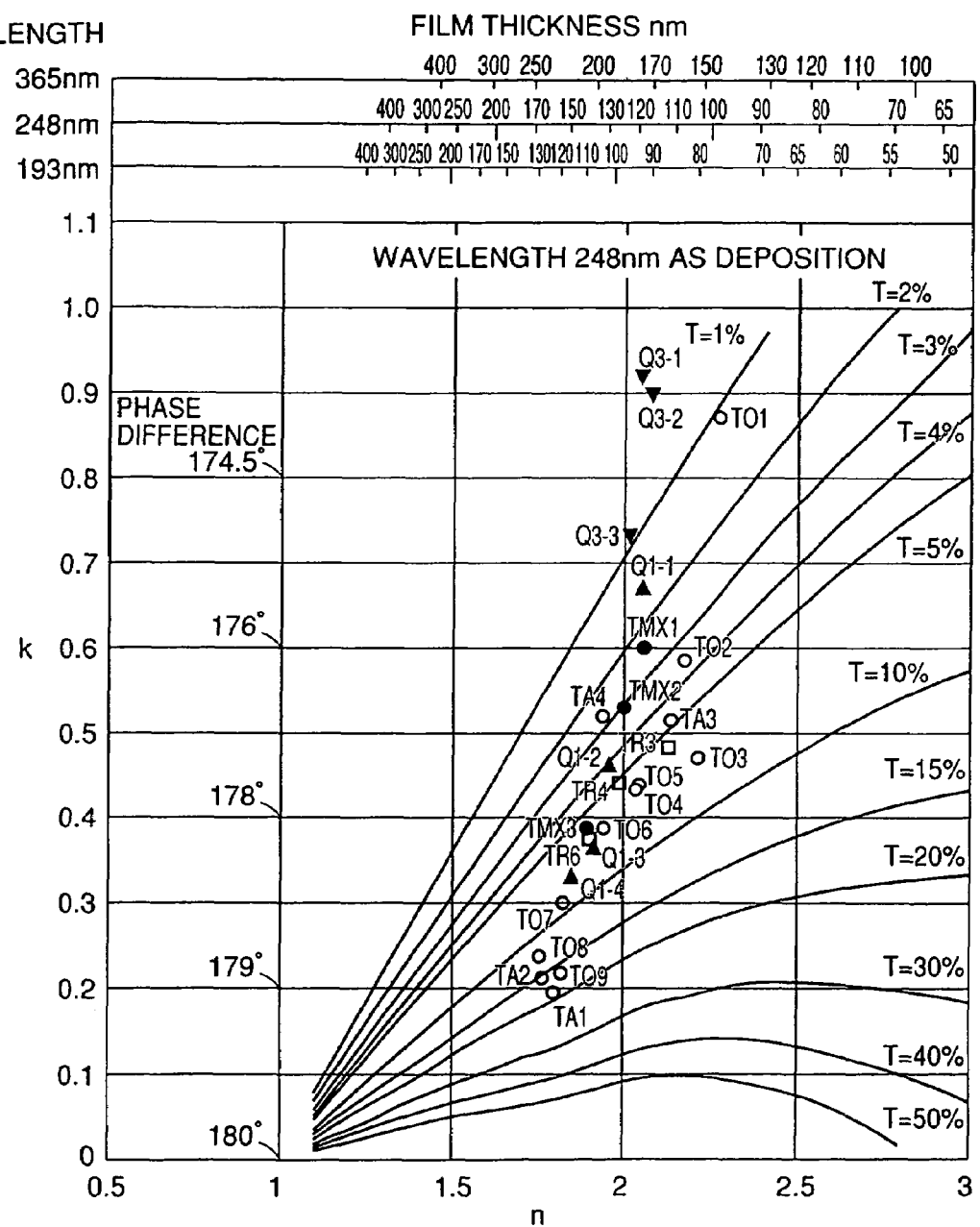
FIG. 3 is a diagram showing a phase shifter film of each sample in an KrF laser plotted based on its optical characteristics.

First, FIGS. 2 and 3 show a diagram indicating n values of the optical constants (n−i×k: n; refractive index, k; extinction coefficient) along the horizontal axis and k values along the vertical axis wherein the optical characteristics of the samples T01 to T09, TR3, 4, 6 and TA1 to TA4 as shown in Tables 1, 6 and 7 are plotted. Here, FIG. 2 concerns an ArF laser (193 nm) and FIG. 3 concerns a KrF laser (248 nm).

As shown in Tables 6 and 7 as well as in FIGS. 2 and 3, a phase shift film, which has a high quality of 8% or more of transmittance, can be gained in the samples T08, TR4, TA1, TA2 and TA4 with respect to an ArF laser (193 nm).

In addition, a phase shift film, which has a high quality of 8% or more of transmittance, can be gained in the samples T06 to T09 and in TA1 and TA2 with respect to a KrF laser (248 nm).

(Evaluation 2)

The evaluation of a phase shift film including a molybdenum silicide oxide nitride film in the case that the reactive gas is introduced in the mixed condition as shown in the above Example 2 is described.

In the same manner as in Evaluation 1, FIGS. 2 and 3 show a diagram indicating n values of the optical constants (n−i×k) along the horizontal axis and k values along the vertical axis wherein the optical characteristics of the samples TMX1 to TM3 as shown in Tables 2, 6 and 7 are plotted. Here, FIG. 2 concerns an ArF laser (193 nm) and FIG. 3 concerns a KrF laser (248 nm).

As shown in Tables 6 and 7 as well as in FIGS. 2 and 3, in the case that the reactive gas is introduced in the mixed condition, though a phase shift film which has such a high quality as in Evaluation 1 cannot be gained, it is possible to form a phase shift film of which the transmittance is relatively high such that the transmittance of the sample TMX3 is 4.471% with respect to an ArF laser (193 nm) and the transmittance of the sample TMX3 is 5.327% with respect to a KrF laser (248 nm).

(Evaluation 3)

The evaluation of a phase shift film including a molybdenum silicide oxide nitride film shown as the samples TS1 to TS4, TS6 and TS7 in Tables 3 and 9 as shown in the above Example 3 is described.

A double layer structure is adopted in the samples TS 1 to TS4, TS6 and TS7 as shown in Table 9 where a film of which the absorption is high and of which the chemical resistance properties are excellent is formed as the upper layer while a film of which the absorption is low and of which the chemical resistance properties are poor is formed as the lower layer. By using the double layer structure the transmittance for the inspection wavelength (365 nm) is designed to be less than approximately 40%. This principle is the same as in background technology 2.

As for the film formation conditions for each layer of the double layer film as shown in Table 3, either of the set of film formation conditions as shown in Table 3 is adopted. The corresponding relationship means that, in the case that the $N_2O$ gas flow amount as shown in Table 3 and the $N_2O$ gas flow amount in the upper layer or in the lower layer of Table 4 are the same then other film formation conditions are also the same.

(Evaluation 4)

The evaluation of a phase shift film including a molybdenum silicide oxide nitride film shown as the samples TM1 to TM4 in Tables 4 and 10 and the samples TS1 to TS6 and TS7 in Table 9 as shown in the above Example 4 is described.

The n values and k values of the samples TS1 to TS6 and TS7 as shown in Table 9 have the optical characteristics which guarantee the characteristics of Table 10. Table 10 shows the evaluation of the two layers which have the film structure and which are formed according to the film formation conditions as in Table 4 which investigates whether or not the optical characteristics of the samples TM1 to TM4, to which sintering processing of 350 degrees (° C.) and 3 hr is applied, are applicable as blanks for a halftone phase shift mask in a photo mask for ArF laser exposure.

As is seen in Table 10, the phase difference of 175° to 180° in the ArF exposure wavelength and the transmittance of 2% to 9% are gained while the transmittance of less than 42.5% is gained for the defect inspection wavelength of 365 nm, and, therefore, it is shown that the samples are sufficiently available for practical use.

Second Embodiment

Figure 4:
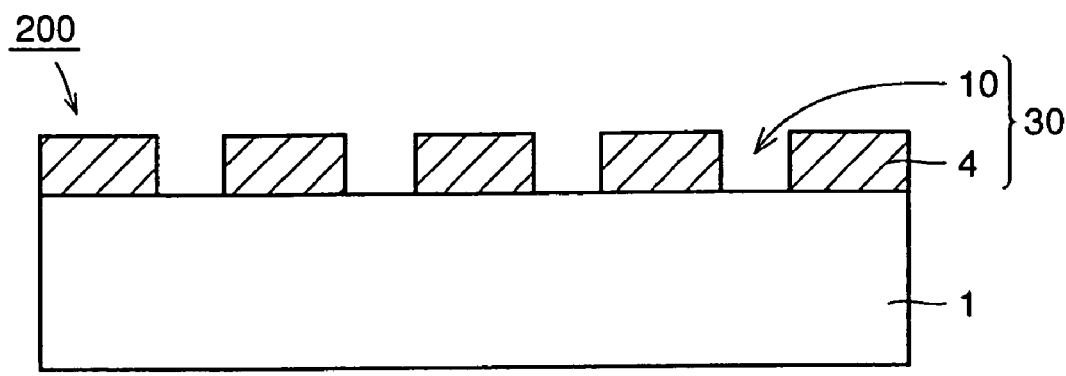
FIG. 4 is a cross section view of the structure of a phase shift mask according to a second embodiment based on this invention.

Next, a phase shift mask, which has the above described phase shifter film and a method thereof, are described in the following. First, referring to FIG. 4, the structure of a halftone type phase shift mask in this second embodiment is described. This halftone type phase shift mask includes a transparent substrate 1 made of crystal, which transmits exposure light, and a phase shift pattern 30 formed on the main surface of this transparent substrate 1. This phase shift pattern 30 is configured of the first light transmission part 10, wherein the transparent substrate 1 is exposed, and of the second light transmission part 4, wherein the phase and the transmittance of the transmitted exposure light is converted by approximately 180° with respect to the phase of exposure light, which transmits through the first light transmission part 10, and which has a necessary transmittance (for example 1% to 40%) and is made of a single material.

Figure 5A:
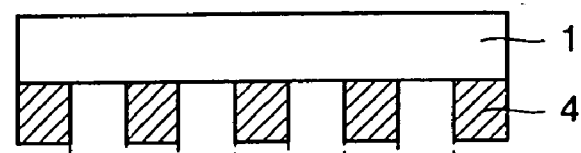
FIGS. 5A, 5B and 5C are schematic diagrams showing an electric field on the mask and an electric field on the wafer in the case where a phase shift mask is used based on this invention.
Figure 5B:
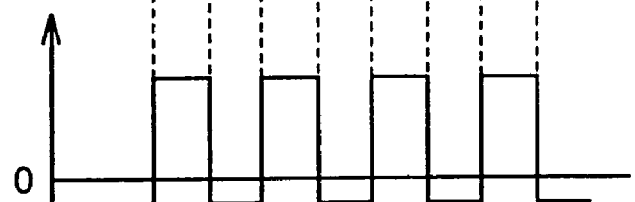
Figure 5C:
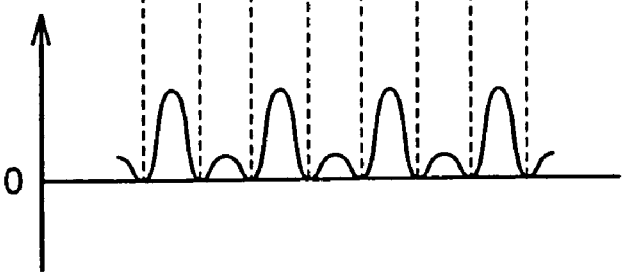

Next, referring to FIGS. 5A, 5B, 5C the electric field on the mask of exposure light, which transmits the phase shift mask 200 having the above described structure, and light intensity on the wafer, are described.

Referring to FIG. 5A, a cross section view of the above described phase shift mask 200 is shown. Referring to FIG. 5B, since the electric field on the mask is inverted in the phase at the edge of the exposure pattern, the electric field always becomes 0 at the edge parts of the exposure pattern. Therefore, referring to FIG. 5C, the difference of the electric field on the wafer between the light transmission part 10 and the phase shift part 4 of the exposure pattern becomes sufficient so that it becomes possible to gain a high resolution.

Next, with respect to a process for a phase shift mask 200, the case where a molybdenum silicide oxide nitride film is used as a phase shifter film is described.

FIGS. 6 to 9 are cross section structural views showing the process in accordance with the cross section of the phase shift mask 200 as shown in FIG. 3.

Figure 6:
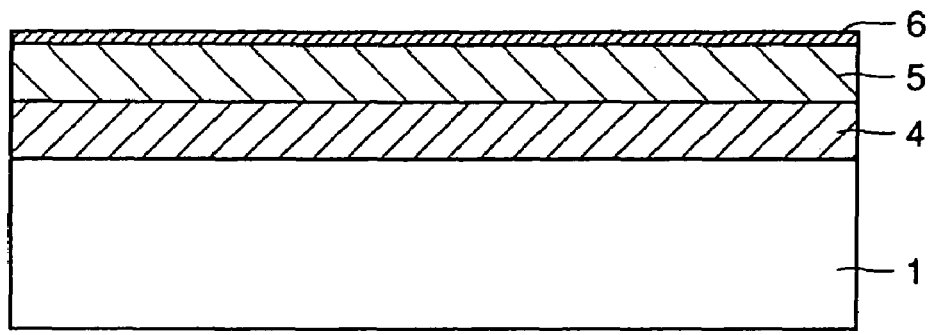
FIG. 6 is a cross section view showing the first step of a process for a phase shift mask according to the second embodiment based on this invention.

First, referring to FIG. 6, a phase shifter film 4 made of a molybdenum silicide oxide nitride film is formed on the transparent substrate 1 by using the LTS method. Here, under the same film formation conditions as in the above described sample T03 of Table 1, a phase shifter film 4 made of a single layered molybdenum silicide oxide nitride film is formed to have the film thickness of approximately 1134 Å.

In this case, blanks for a phase shift mask of the wavelength of 248 nm and the phase shift amount of approximately 180 degrees can be gained. In this manner, the phase shifter film 4 formed on the transparent substrate 1 is referred to as blanks for a phase shift mask.

After that, a heat treatment of 200 degrees (° C.) or more is carried out by using a clean oven, or the like, in order to stabilize the transmittance of this phase shifter film 4.

Thereby, the fluctuation of the transmittance (0.5 to 1.0%) due to the heat treatment (approximately 180 degrees (° C.) such as in a resist application process for the film formation of a conventional phase shifter film can be prevented.

Next, on this phase shifter film 4, a resist film 5 for an electron beam (Zeon Corporation: ZEP-810S (registered trademark)), or the like, is formed so as to have the film thickness of approximately 5000 Å. After that, a static charge prevention film 6 (made by Showa Denko: Espacer 100 (registered trademark)), or the like, is formed approximately 100 Å in order to prevent the static charge at the time of exposure of an electron beam since the molybdenum silicide oxide nitride film is not conductive.

Next, referring to FIG. 7, the resist film 5 for an electron beam is exposed with an electron beam and the static charge prevention film 6 is removed through cleaning with water. After that, by developing the resist film 5, the resist film 5 with a predetermined resist pattern is formed.

Figure 8:
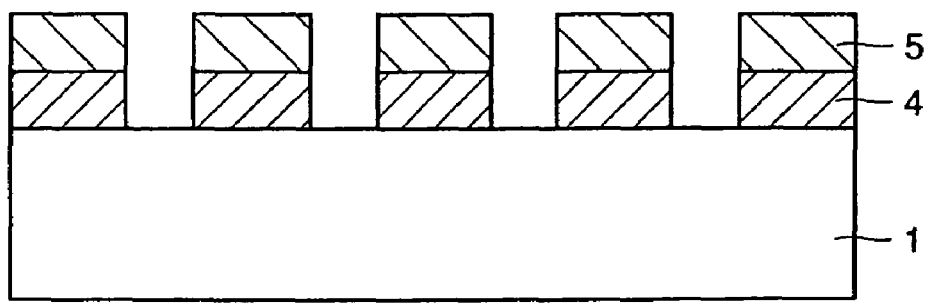
FIG. 8 is a cross section view showing the third step of a process for a phase shift mask according to the second and third embodiments based on this invention.

Next, referring to FIG. 8, the phase shifter film 4 is etched by using the above described resist film 5 as a mask. As for the etching device at this time, a parallel plate type RF ion etching device is used and the etching is carried out for the etching time of approximately 11 minutes with the distance between electrode substrates being 60 mm, the operational pressure being 0.3 Torr and through the use of CF4+02 reactive gases with respective flow amounts of approximately 95 sccm and approximately 5 sccm.

Figure 9:
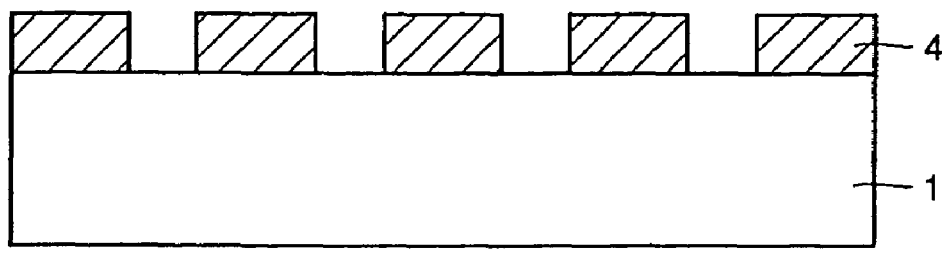
FIG. 9 is a cross section view showing the fourth step of a process for a phase shift mask according to the second and third embodiments based on this invention.

Next, referring to FIG. 9, the resist film 5 is removed. As described above, a phase shift mask in this second embodiment is completed.

Third Embodiment

Figure 10:
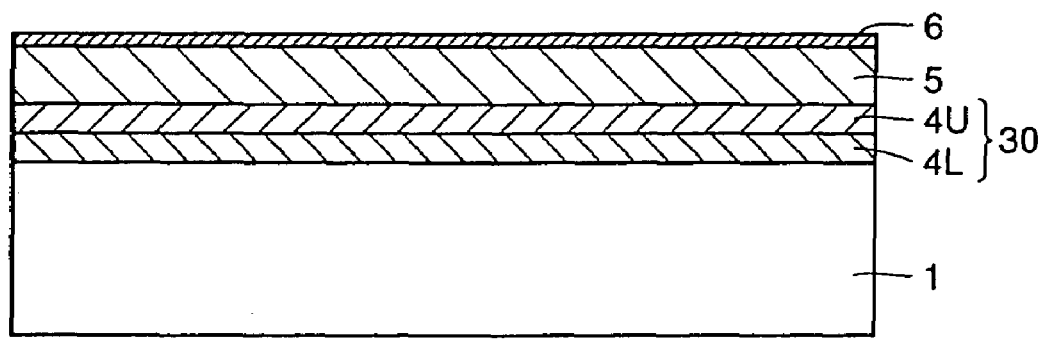
FIG. 10 is a cross section view showing the first step of a process for a phase shift mask according to the third embodiment based on this invention.

Next, the case where halftone phase shift mask blanks for ArF laser exposure are formed under the same film formation conditions as in the above described sample TM3 in Table 4 is described. Referring to FIG. 10, a lower layer phase shifter film 4L made of molybdenum silicide oxide nitride film with the film thickness of approximately 818 Å is formed on the number 6025 crystal substrate under the film formation conditions of TM3 in Table 4.

After that, an upper layer phase shifter film 4U made of a molybdenum silicide oxide nitride film with the film thickness of approximately 300 Å is formed on the above lower layer phase shifter film 4L. These lower layer phase shifter film 4L and upper layer phase shifter film 4U form the phase shifter film 4.

Next, a sintering process is carried out on the phase shifter film 4 formed of this two layer structure in the atmosphere of 350 degrees (° C.) for 3 hours so as to complete the phase shift mask blanks.

The optical characteristics of the phase shift mask blanks which have been gained in such a manner correspond to the sample TM3 of Table 10 and exhibit the transmission of approximately 6%, the phase gap of approximately 180 degrees (° C.) with the wavelength of 193 nm.

The evaluation of the phase difference is carried out by a phase difference gauge for the ArF wavelength made by Laser Tech Co. Ltd. and through calculation of the optical constant. The transmittance for the defect detection wavelength of 365 nm is 36%.

A predetermined pattern is formed on the phase shifter film 4 through the same steps as in the above described first embodiment by using the gained halftone phase shift mask blanks for ArF laser exposure. In addition, as for the evaluation of the phase shift film the same evaluation as in the above (Evaluation 3) is gained.

Here, though in the above described first to third embodiments the case where the distance between T/S is 400 mm is described, a range of 100 mm to 600 mm can be applied due to an application field.

In addition, though in the above first to third embodiments $N_2O$ is utilized as a reactive gas, it is possible to utilize NO, $N_2+O_2$ or a mixture gas containing these. In addition, though Ar is utilized as an inert gas, it is possible to use other inert gases (gases which belong to group O of the periodic table) such as He, Ne, and Kr.

In addition, though in each of the above described embodiments, the LTS method is applied for a molybdenum silicide type halftone phase shifter film, metal fluoride such as $CrF_x$, metal silicide oxide such as $ZrSiO_x$ or metal silicide oxide nitride such as $ZrSiO_xN_y$ are cited as other materials for the halftone phase shifter film.

Fourth Embodiment

Next, the fourth embodiment based on this invention is described. In this third embodiment a metal film for static charge prevention at the time of exposure by electron beam or a laser light is formed on the phase shifter film in a process for a phase shift mask.

In the following, referring to FIGS. 11 to 15, a process for a phase shifter film is described. FIGS. 11 to 15 show a cross section structural view corresponding to the cross section of the phase shift mask as shown in FIG. 1.

Figure 11:
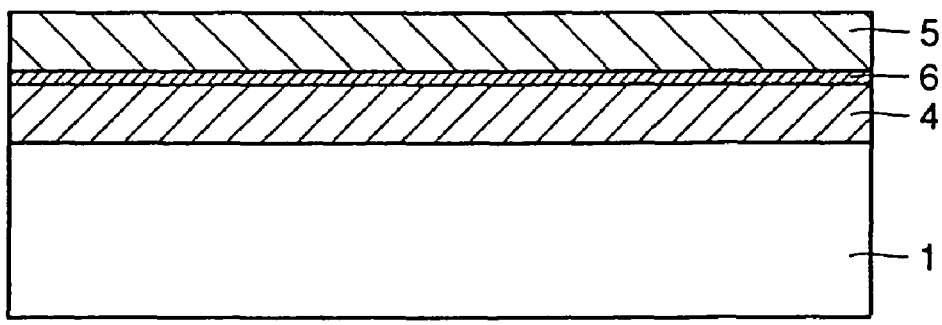
FIG. 11 is a cross section view showing the first step of a process for a phase shift mask according to a fourth embodiment based on this invention.

First, referring to FIG. 11, a phase shifter film 4 made of a molybdenum silicide oxide nitride film is formed on the transparent substrate 1 in the same manner as in the first or second embodiment.

After that, a static charge prevention film 6 with the film thickness of approximately 100 to 500 Å is formed on this phase shifter film 4. As for the film quality of this static charge prevention film 6, a molybdenum film is formed since the film quality of the phase shifter film is Mo based. This is because the phase shifter film 4 made of molybdenum silicide oxide nitride which is formed through the above described method is not conductive. After that, a resist film 5 for an electron beam with the film thickness of approximately 5000 Å is formed on the above static charge prevention film 6.

Figure 12:
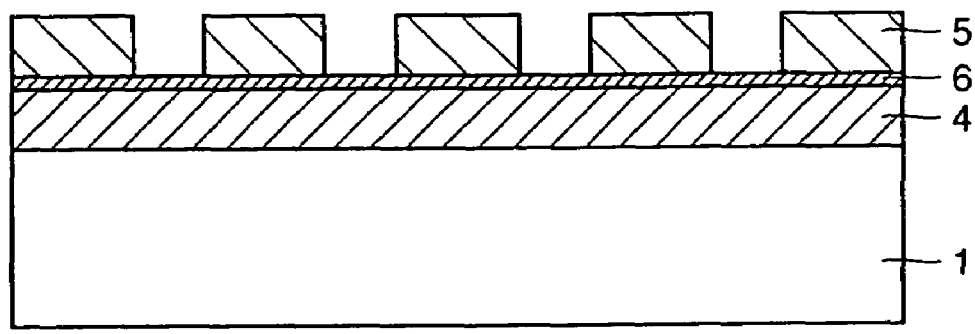
FIG. 12 is a cross section view showing the second step of a process for a phase shift mask according to the fourth embodiment based on this invention.

Next, referring to FIG. 12, a resist film 5 with a desired resist pattern is formed by exposing predetermined positions of the resist film 5, for an electron beam, with an electron beam and by developing it.

Figure 13:
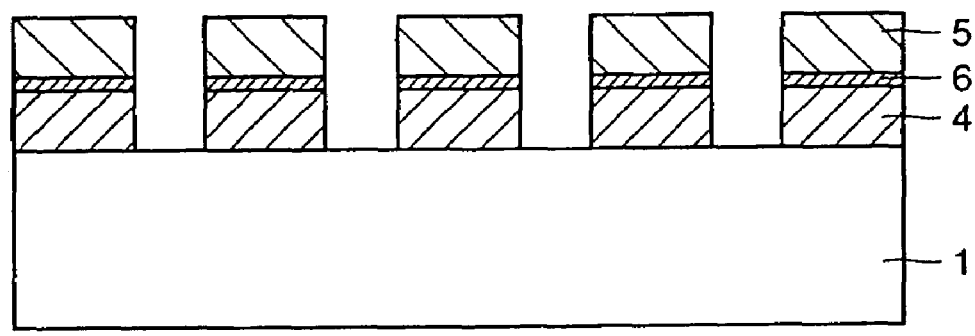
FIG. 13 is a cross section view showing the third step of a process for a phase shift mask according to the fourth embodiment based on this invention.

Next, referring to FIG. 13, in the case that the static charge prevention film 6 is Mo based, the static charge prevention film and the phase shifter film 4 are sequentially etched through dry etching by using $CF_4+O_2$ gas and by using the resist film 5 for an electron beam as a mask.

Figure 14:
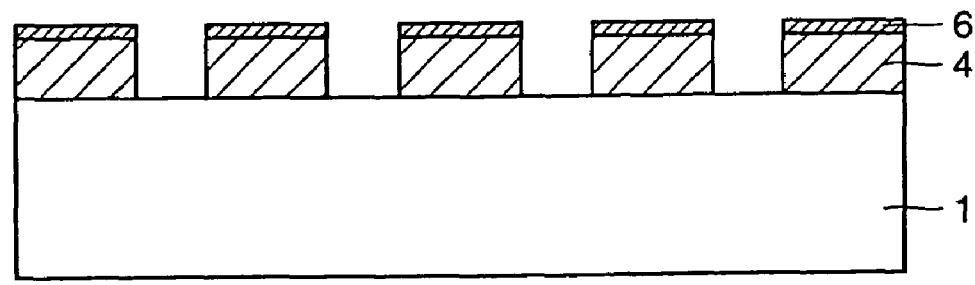
FIG. 14 is a cross section view showing the fourth step of a process for a phase shift mask according to the fourth embodiment based on this invention.
Figure 15:
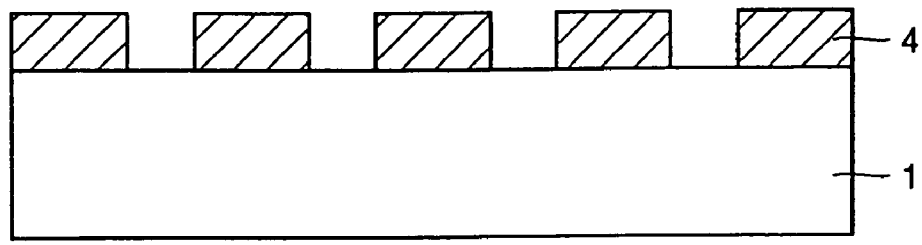
FIG. 15 is a cross section view showing the fifth step of a process for a phase shift mask according to the fourth embodiment based on this invention.

Next, referring to FIG. 14, the resist film 5 is removed by using $O_2$ plasma, or the like. After that, referring to FIG. 15, the static charge prevention film 6 is etched and removed by using etching liquid (ceric ammonium nitrate/perchloric acid mixture solution), or the like.

Thereby, the phase shift mask is completed.

Here, though in the etching of the above described phase shift mask, in the case that the phase shift mask is MoSi based, a static charge prevention film made of a molybdenum film is formed, the invention is not limited to this and in the case that the phase shift mask is Cr based, an MoSi film may be used as a static charge prevention film or in the case of an Mo based phase shifter film a Cr based static charge prevention film may be used so that the same working effects can be gained.

As described above, by providing a molybdenum film at the time of the manufacturing steps for a phase shift mask, it becomes possible to prevent a static charge at the time of electron beam exposure and it also becomes possible to make the film serve as an optical reflection film of the optical position detector.

Here, though in the present embodiment, a molybdenum film is used as a static charge prevention film, metal films which can gain the same effects, for example, films of W, Ta, Ti, Si, Al or, alloys thereof, may be used.

Fifth Embodiment

A structure of blanks for a phase shift mask used in the above embodiment is described as the fifth embodiment referring to the following FIGS.

Figure 16A:
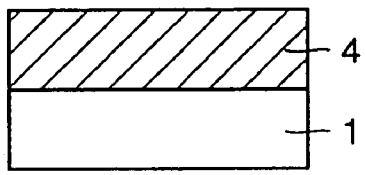
FIGS. 16A and 16B are cross section views of blanks for a phase shift mask according to a fifth embodiment based on this invention.
Figure 16B:
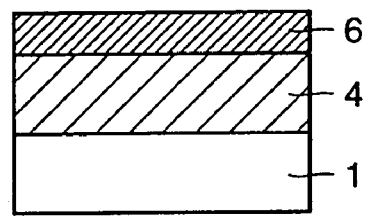

As for the structure of blanks for a phase shift mask used in the above described embodiment, two types of structures can be cited as shown in FIGS. 16A and 16B. In the structure as shown in FIG. 16A, the phase shifter film 4 is formed on the transparent substrate 1 while in the structure as shown in FIG. 16B, the phase shifter film 4 is formed on the transparent substrate 1 and, in addition, the metal film 6 is formed on this phase shifter film 4.

In the case that a phase shift mask is formed by using these blanks for a phase shift mask, the formation procedure differs depending on the drawing device for exposing the resist film 4. For example, (1) the case where the resist film is exposed by utilizing an electron beam and (2) the case where the resist film is exposed by utilizing a laser have different formation procedures.

(1) The case where the resist film is exposed by utilizing an electron beam

Figure 17A:
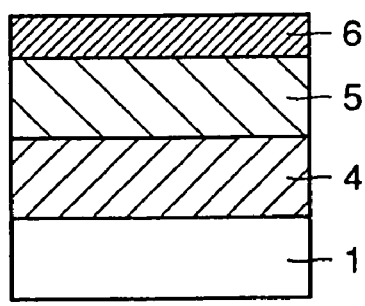
FIGS. 17A and 17B are cross section views showing a process for blanks for a phase shift mask according to the fifth embodiment based on this invention.
Figure 17B:
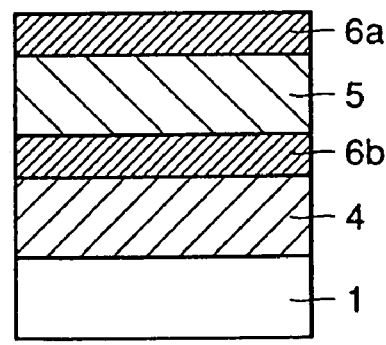

First, the case where the resist film is exposed by utilizing an electron beam is described referring to FIGS. 17A and 17B.

In the case where the resist film is exposed by utilizing an electron beam, the formation procedure differs between cases, wherein an acceleration voltage is 10 keV or is 20 keV or more.

(i) The case of 10 keV

As shown in FIG. 17A, the phase shift film 4 is formed on the transparent substrate 1, the resist film 5 is formed on this phase shift film 4 and the static charge prevention film 6 made of conductive polymer is formed on this resist film 5.

Next, the resist film 5 is exposed by an electron beam. After that, through cleaning with water the static charge prevention film 6 is removed.

Next, the resist film 5 is developed. After that, etching of the phase shifter film is carried out. After that, the resist film is removed.

Or, as shown in FIG. 17B, the phase shift film 4 is formed on the transparent substrate 1, a metal film 6b is formed on this phase shift film 4, the resist film 5 is formed on this metal film 6b and a static charge prevention film 6a made of conductive polymer is formed on this resist film 5.

Next, the resist film 5 is exposed by an electron beam. After that, the static charge prevention film 6 is removed through cleaning with water.

Next, the resist film 5 is developed. After that, etching of the metal film 6b is carried out.

Next, etching of the phase shifter film is carried out. After that, the resist film is removed. After that, the metal film is removed.

Or, in the case as shown in FIG. 17B, the following manufacturing method, as a well-developed manufacturing method, can be adopted after the resist film is removed.

After the resist film is removed another resist film is formed. After that, a conductive film is formed on this resist film.

Next, the resist film is exposed by an electron beam (the resist is made to remain on the parts through which no light transmits at the time of exposure of the substrate).

Next, the static charge prevention film is removed through cleaning with water. After that, the resist film is developed. After that, etching of the metal film is carried out. After that, the resist film is removed.

(ii) The case of 20 keV or more

In the case of the blanks structure for a phase shift mask as shown in FIG. 17A, the phase shift mask is formed during the same procedure as in the above case of 10 keV.

And, in the case of the blanks structure for a phase shift mask as shown in FIG. 17B, the formation of the static charge prevention film 6a made of conductive polymer becomes unnecessary since the metal film 6b functions as a static charge prevention film. Here, in the case of the above described well-developed manufacturing method, the static charge prevention film 6a made of conductive polymer is necessary.

(2) The case where the resist film is exposed by utilizing a laser

In the case of the blanks structure for a phase shift mask as shown in FIG. 17A, the formation of the static charge prevention film 6 made of conductive polymer is unnecessary.

In the case of the blanks structure for a phase shift mask as shown in FIG. 17B, the formation of the static charge prevention film 6b made of conductive polymer is unnecessary. And, here, in this case of the above described well-developed manufacturing method, the formation of the static charge prevention film 6 is unnecessary.

Sixth Embodiment

Figure 18:
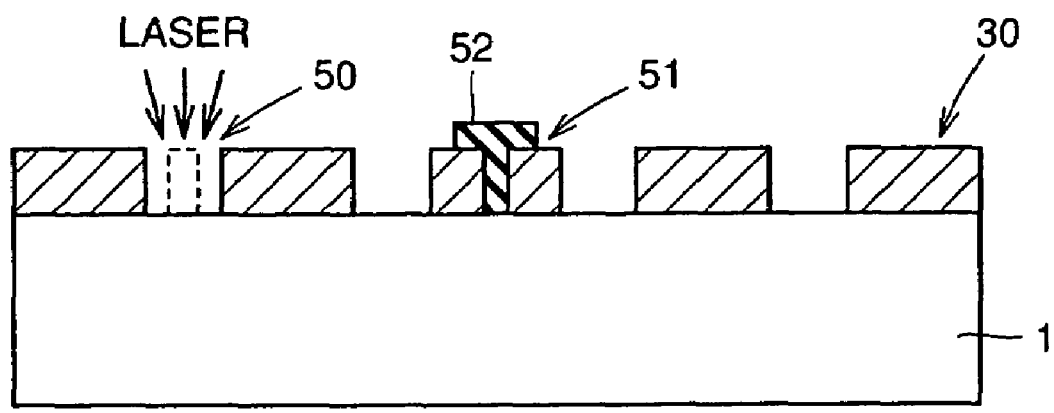
FIG. 18 is a cross section view showing a defect correction method of a phase shift mask based on this invention.

Next, with respect to phase shift masks in the above described first To fifth embodiments, a defect inspection method and a defect correction method in the case that a residue defect (black defect) 50 or a pinhole defect (white defect) 51 occur as shown in FIG. 18 are described.

First, with respect to a manufacturing phase shift mask, a defect inspection of chip comparison type is carried out by using a light transmission type defect inspection device.

This defect inspection device carries out an inspection by using light from the light source of a mercury lamp.

As a result of the inspection, residue defects, where residues of the phase shifter film remain in the place that the pattern should be etched, and pinhole defects, wherein the positions where the phase shifter film should remain have been missed so that pinholes or missing parts occur, are detected.

Next, these defects are corrected. As for the residue defects, a laser blow correction device by means of a YAG laser which is used for a conventional photo mask is utilized.

In addition, as another method removal can be carried out through assist etching by means of the gas introduction of spatter etching by an FIB.

In addition, though in the above described defect inspection device, the inspection is carried out with light from the light source of a mercury lamp, the residue defects can be corrected by the same method even in the case where the inspection is carried out with light from the light source of a laser.

Next, as for the pinhole defects, the correction is carried out by filling in the pinhole defect parts through the deposition of carbon based film 52 by an FIB assist deposition method which is used for a conventional photo mask.

In this manner, an excellent phase shift mask can be gained of which the carbon based film 52 will not peel off even in the case that the corrected phase shift mask is cleaned.

Next, an exposure method using the above described phase shift mask is described.

Figure 19:
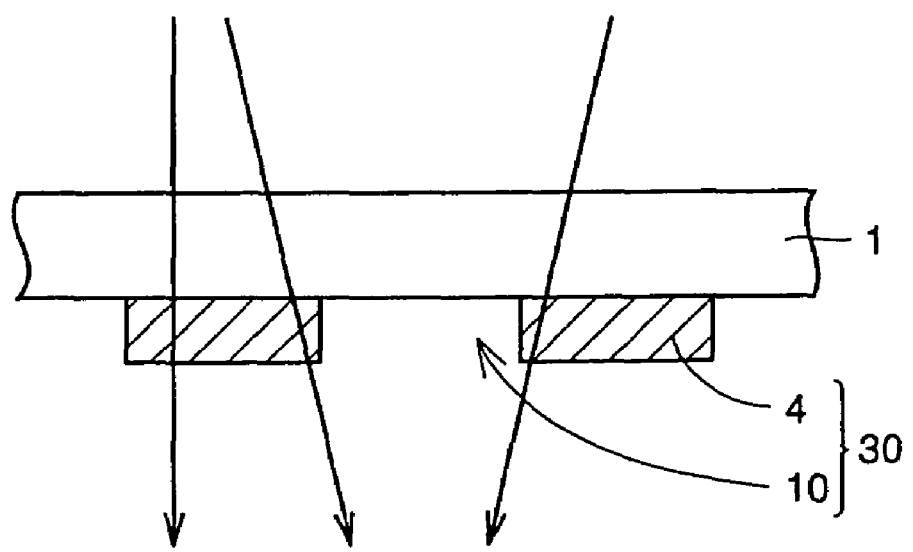
FIG. 19 is a schematic diagram showing a condition of an exposure method using a phase shift mask based on this invention.

In the case that this phase shift mask is used, the phase shift mask is formed with the film thickness of approximately 680 Å to 2600 Å as shown in the film thickness dimension (ds) of Tables 6 to 8. Therefore, it becomes possible to give the phase difference of 180° with respect to the exposure light, which is the diagonal component included in the exposure light as shown in FIG. 19, since the phase shifter film is formed with approximately half the film thickness of a conventional phase shifter film.

Figure 20:
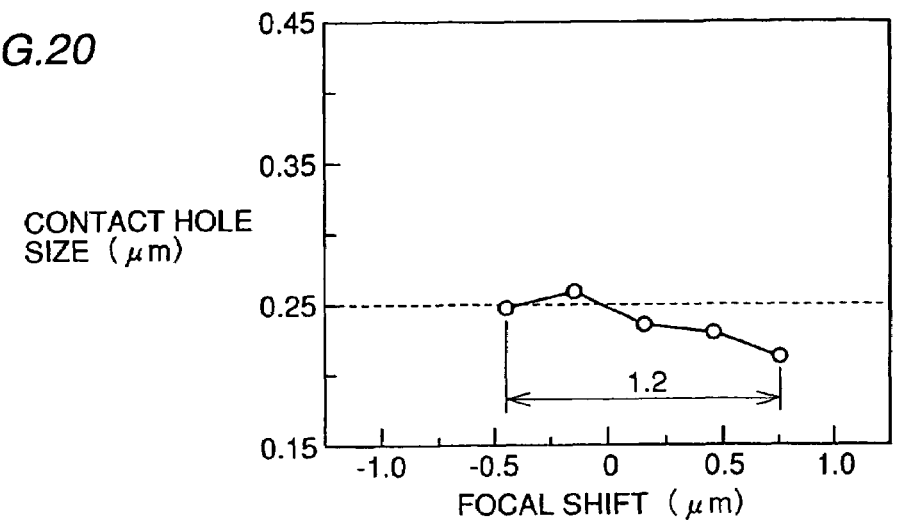
FIG. 20 is a diagram showing the relationship between the focus shift and the contact hole size in an exposure method using a phase shift mask based on this invention.

As a result, as shown in FIG. 20, in the case that contact holes of, for example, 0.25 μm are attempted to be opened it becomes possible to tolerate a focus shift of 1.2 μm. In addition, in the case of a conventionally used photo mask, a focus shift of only 0.6 μm can be tolerated when contact holes of the same 0.25 μm are opened as shown in FIG. 21.

Figure 22:
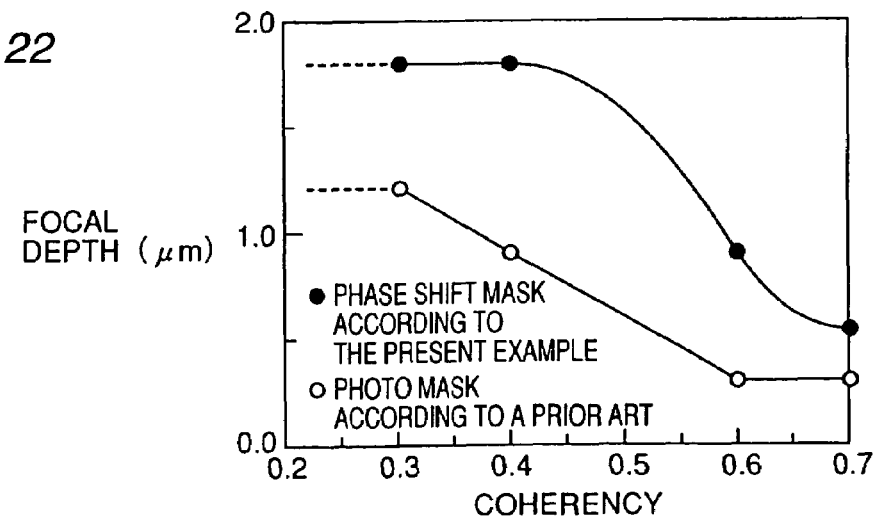
FIG. 22 is a diagram comparing the relationship between the coherency and the focal depth in an exposure method using a phase shift mask based on this invention versus that in an exposure method using a phase shift mask according to the prior art.

In addition, in an exposure device of which the coherency is 0.3 to 0.7, preferably 0.6 to 0.7, it becomes possible to significantly increase the focal depth in comparison with a conventional photo mask as shown in FIG. 22.

Figure 21:
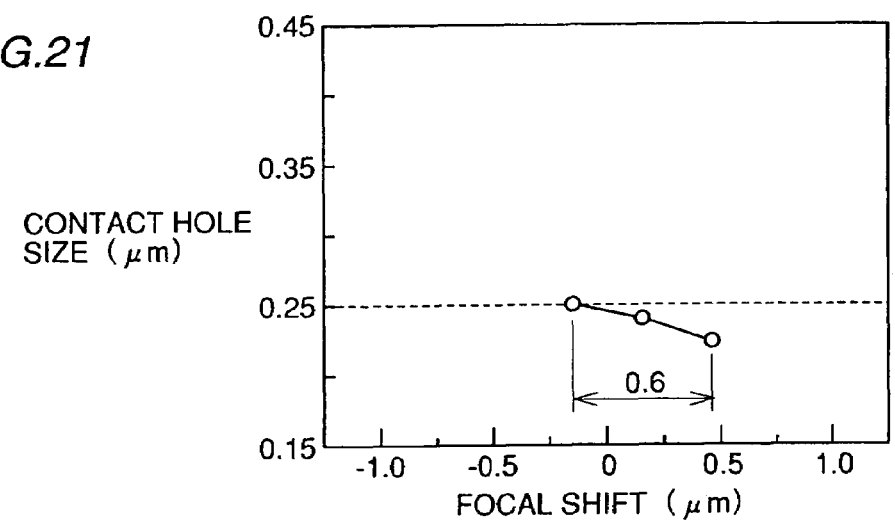
FIG. 21 is a diagram showing the relationship between the focus shift and the contact hole size in an exposure method using a photo mask according to a prior art.

Here, though FIGS. 20 to 22 show results in the case that a scaling projection exposure device, of 5:1, is used, scaling projection exposure devices of which the scaling ratios are 4:1 and 2.5:1 or a projection exposure device of 1:1 may be used so that the same working effects can be gained. Furthermore, a close contact exposure or a proximity exposure, in addition to the projection exposure device, can be used to gain the same effects. Moreover, the above described exposure method can gain the same working effects by using any of a g-line, an i-line, a KrF laser, or the like.

As described above, according to the exposure method using a phase shift mask in this embodiment, it becomes possible to prevent exposure defects from occurring and, therefore, it becomes possible to increase the yield in the manufacturing steps of a semiconductor device. This exposure method can be effectively used in the manufacturing steps of semiconductor devices such as 64M, 128M, 256M or 1G DRAM, SRAM, flash memory, ASIC, micro computer, GaAs, or the like, and, furthermore, it becomes possible to satisfactorily use this in the manufacturing steps of single semiconductor device or a liquid crystal display.

Here, the embodiments disclosed herein are illustrative from all points of view and should not be considered as limitative. The technical scope of the present invention is defined not by the above description but, rather, by the scope of the claims and is intended to include equivalent meanings of the scope of the claims and all of the modifications within the scope.

As described above, according to a phase shift mask and a process thereof, or the like, based on this invention, high transmittance can be gained in the ArF laser exposure light wavelength (193 nm) or in the KrF laser exposure light wavelength (248 nm). In addition, a low defect halftone phase shift mask can be gained. Since this is a film, formed by low pressure sputtering, adopting the LTS system, the density of active gases or inert gases becomes low so that grains of molybdenum silicide spattered from the sputtering target reach the substrate with a high accuracy of directness and a film with a high density, that is to say, a film of high refraction can be gained.

In addition, since the T/S distance is sufficiently large, the effects gained from reactive gases reaching the sputtering target become smaller so as to reduce oxidation and nitriding of the target and, thereby, factors of defect occurrence, such as particles of the mask or pinholes, can be avoided.

In addition, reactive gases do not reach the sputtering target to a great degree, even when the gases are supplied in a large volume and, therefore, oxidation and nitriding occur sufficiently on the substrate so that it becomes possible to gain a film of high transmittance.

This invention relates to a phase shift mask and, in particular, relates to a structure of an attenuation type phase shift mask which attenuates light of exposure wavelength, and a process thereof, as well as provides a halftone type phase shift mask which is applicable to an ArF laser or a KrF laser by using molybdenum silicide based materials. In addition, in connection with this phase shift mask, a process for gaining that phase shift mask as well as a phase shifter film and a process thereof, blanks for a phase shift mask and a process thereof, an exposure method by using that phase shift mask, a semiconductor device manufactured by using that phase shift mask, a defect inspection method of that phase shift mask and a defect correction method of that phase shift mask are provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A process for making a phase shifter film used for a phase shift mask, characterized in that said phase shifter film is formed by using a reactive long throw sputtering method;
   wherein said reactive long throw sputtering method separately introduces a reactive gas into a substrate side and an inert gas into a target side, respectively;
   wherein the pressure is $7.5 \times 10^{-4}$ Torr or less;
   wherein the distance between said target and said substrate is 100 mm or more; and
   wherein the flow amount ratio of said reactive gas to said inert gas is $50\% \leq$ reactive gas/inert gas $\leq 80\%$.

2. The process for a phase shifter film according to claim 1, wherein said step of forming a phase shifter film further includes the step of carrying out a heat process of 200 degrees (° C.) or more after forming said phase shifter film.

3. The process for a phase shifter film according to claim 1, wherein said phase shifter film is made of a molybdenum silicide oxide nitride.

* * * * *